United States Patent [19]

Kosaki et al.

[11] Patent Number: 5,800,667
[45] Date of Patent: Sep. 1, 1998

[54] APPARATUS FOR ADHERING WAFER TO SUPPORTING SUBSTRATE

[75] Inventors: Katsuya Kosaki; Takeshi Kuragaki, both of Tokyo, Japan

[73] Assignee: Mitsubishi Denki Kabushiki Kaisha, Tokyo, Japan

[21] Appl. No.: 756,604

[22] Filed: Nov. 26, 1996

[30]     Foreign Application Priority Data

Jun. 26, 1996  [JP]  Japan .................... 8-166214

[51] Int. Cl.$^6$ ............................................. B30B 15/00
[52] U.S. Cl. ................ 156/382; 156/583.1; 156/583.3
[58] Field of Search ................................. 156/228, 285, 156/286, 382, 580, 583.1, 583.3, 381

[56]          References Cited

U.S. PATENT DOCUMENTS

| | | | |
|---|---|---|---|
| 4,953,287 | 9/1990 | West et al. ...................... | 29/611 |
| 5,161,697 | 11/1992 | Quick ............................. | 209/552 |
| 5,297,480 | 3/1994 | Miyashita et al. ................ | 100/90 |
| 5,545,283 | 8/1996 | Collins et al. .................. | 156/382 |
| 5,578,159 | 11/1996 | Miyashita et al. ............... | 156/358 |

FOREIGN PATENT DOCUMENTS 2123726   5/1990   Japan .
369226    7/1991   Japan .

*Primary Examiner*—James Sells
*Attorney, Agent, or Firm*—Leydig, Voit & Mayer, Ltd.

[57]           ABSTRACT

An apparatus for adhering a wafer to a supporting substrate includes a chamber having a lower part including a wafer stage having a planar surface on which a wafer having a surface covered with an adhesive is mounted with the adhesive facing upward, an upper part for covering the planar surface of the wafer stage, an evacuation port for evacuating the chamber, and a pressure plate opposite a supporting substrate disposed on the wafer and movable downward so that the pressure plate presses the supporting substrate toward the wafer. At least three gauge blocks having a thickness larger than that of the wafer are disposed on the planar surface of the wafer stage, surrounding a wafer and sandwiched between the supporting substrate and the planar surface when the supporting substrate is pressed toward the wafer. Heaters for heating the wafer and the supporting substrate are embedded in the lower and upper parts of the chamber. A gap between the wafer and the supporting substrate and filled with the adhesive is uniform within the area of the wafer surface.

7 Claims, 7 Drawing Sheets

APPARATUS FOR ADHERING WAFER TO SUPPORTING SUBSTRATE

FIELD OF THE INVENTION

The present invention relates to a method and an apparatus for adhering a semiconductor wafer, such as a GaAs wafer or an InP wafer, to a substrate for supporting and reinforcing the wafer with an adhesive, such as wax.

BACKGROUND OF THE INVENTION

When a fragile wafer comprising GaAs or InP is polished or the polished surface is etched or metallized, the wafer is reinforced by a supporting substrate, such as glass or sapphire, adhered to the wafer with an adhesive, such as wax.

FIGS. 7(a) and 7(b) are cross-sectional views illustrating a conventional apparatus for adhering a wafer to a supporting substrate. This apparatus comprises a wafer stage (a lower part of a chamber) 42 on which a wafer 1 and a supporting substrate 2 are put, an upper part 5 of the chamber (hereinafter referred to as an upper chamber) covering the wafer stage 42, and an expanding and contracting body 52 for pressing the wafer 1 toward the supporting substrate 2. For example, the expanding and contracting body 52 may comprise a rubber sheet. The upper chamber 5 has an evacuation port 51 and an opening 53 for controlling the air pressure inside the expanding and contracting body 52. The space above the wafer stage 42 covered with the upper chamber 5 is hermetically sealed by an O ring 7. The wafer stage 42 has a recess at the upper surface, and the supporting substrate 2 is set in the recess. A wafer guide ring 6 is disposed on the supporting substrate 2, and a wafer 1 with wax 3 is disposed on a portion of the supporting substrate 2 inside the wafer guide ring 6, with the wax 3 contacting the supporting substrate 2. Further, a heater 22 for heating the supporting substrate 2 and the wafer 1 is disposed on the rear surface of the wafer stage 42.

A description is given of a method for adhering a wafer to a supporting substrate using the apparatus shown in FIGS. 7(a) and 7(b). Initially, as illustrated in FIG. 7(a), a supporting substrate 2 is set on the wafer stage 42, and the wafer guide ring 6 is put on the supporting substrate 2. Then, a wafer 1 covered with wax 3 is put on the supporting substrate 2 with the surface having the wax 3 facing downward, and the wafer stage 42 is covered with the upper chamber 5 corresponding to a lid.

Next, as illustrated in FIG. 7(b), the wafer stage 42 is heated to a prescribed temperature by the heater 22 to heat the supporting substrate 2 and the wafer 1, and the air pressure inside the chamber is reduced by evacuating the air through the evacuation port 51. At this time, since the air pressure inside the expanding and contracting body 52 is always set at the atmospheric pressure by the opening 53, the expanding and contracting body 52 expands and pushes the wafer 1 toward the supporting substrate 2, whereby the wafer 1 is adhered to the supporting substrate 2.

In the conventional apparatus, since the supporting substrate 2 and the wafer 1 are heated and the air pressure inside the chamber is reduced when the wafer 1 is pushed toward the supporting substrate 2, the wax 3 is softened while evaporating a volatile component in the wax 3, so that no bubbles remain in the wax 3 when the wafer 1 is adhered to the supporting substrate 2.

However, because of the changeable shape of the expanding and contracting body 52 and inclination of the wafer 1 on the supporting substrate 2, it is difficult to make the thickness of the wax 3 between the wafer 1 and the supporting substrate 2 uniform over the wafer surface, so that the adhesion accuracy cannot be improved. When the rear surface of the wafer 1, the front surface of which is adhered to the supporting substrate 2, is polished to reduce the thickness of the wafer 1 to 25~30 μm, the unevenness of the thickness of the wax 3 between the wafer 1 and the supporting plate 2 within the wafer surface must be significantly smaller than the thickness of the wafer 1 after polishing, but the conventional apparatus cannot provide a sufficiently thin and uniform thickness of the wax 3.

SUMMARY OF THE INVENTION

It is an object of the present invention to provide a method and an apparatus for adhering a wafer to a supporting substrate with improved adhesion accuracy.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method for adhering a wafer to a supporting substrate comprises preparing a wafer having a surface with an adhesive, and a supporting substrate for reinforcing the wafer and having a surface area larger than that of the wafer; disposing the wafer on a planar surface of a wafer stage with the surface having the adhesive facing upward; disposing at least three gauge blocks having a thickness larger than that of the wafer on the planar surface of the wafer stage, surrounding the wafer at equal intervals; disposing the supporting substrate on the wafer and the gauge blocks; heating the wafer and the supporting substrate and evacuating the air around the wafer and the supporting substrate; and pressing the supporting substrate toward the wafer using a pressure plate until the supporting substrate contacts all of the gauge blocks. Therefore, a gap between the wafer and the supporting substrate filled with the adhesive, i.e., the thickness of the adhesive, can be made uniform within the wafer surface.

According to a second aspect of the present invention, a method for adhering a wafer to a supporting substrate comprises preparing a wafer having a surface with an adhesive, and a supporting substrate for reinforcing the wafer and having a surface area larger than that of the wafer; disposing the wafer on a planar surface of a wafer stage with the surface having the adhesive facing upward; disposing at least three gauge blocks having a thickness larger than that of the wafer, spaced apart from the planar surface of the wafer stage, surrounding the wafer at equal intervals; disposing the supporting substrate on the gauge blocks; heating the wafer and the supporting substrate, and evacuating the air around the wafer and the supporting substrate; and pressing the supporting substrate toward the wafer using a pressure plate until all of the gauge blocks contact the planar surface of the wafer stage. Therefore, a gap between the wafer and the supporting substrate filled with the adhesive, i.e., the thickness of the adhesive, can be made uniform within the wafer surface.

According to a third aspect of the present invention, an apparatus for adhering a wafer to a supporting substrate comprises a lower part of a chamber including a wafer stage having a planar surface on which a wafer having a surface with an adhesive is mounted with the adhesive facing upward; an upper part of the chamber covering the wafer mounting planar surface of the wafer stage, including an evacuation port for evacuating the air around the wafer mounting planar surface and a pressure plate opposite a supporting substrate disposed on the wafer to reinforce the wafer, and movable downward so that the pressure plate presses the supporting substrate toward the wafer; at least three gauge blocks having a thickness larger than that of the wafer, disposed on the planar surface of the wafer stage, surrounding the wafer at equal intervals, these gauge blocks being sandwiched between the supporting substrate and the wafer mounting planar surface when the supporting substrate is pressed to the wafer; and heaters for heating the wafer and the supporting substrate, embedded in the lower and upper parts of the chamber. Therefore, a gap between the wafer and the supporting substrate filled with the adhesive, i.e., the thickness of the adhesive, can be made uniform within the wafer surface.

According to a fourth aspect of the present invention, the above-mentioned apparatus further comprises an annular holder having an inner diameter larger than the maximum diameter of the wafer, having a counter bore, on which the supporting substrate is disposed, at the upper surface, and being connected to the wafer stage through an elastic object. Further, the gauge blocks are fixed to the annular holder and contacting the supporting substrate. Therefore, the mechanical stress applied to the wafer and the supporting substrate is reduced, and the wafer and the supporting substrate are maintained parallel to each other, whereby the uniformity of the thickness of the adhesive is further improved.

According to a fifth aspect of the present invention, the above-mentioned apparatus further comprises a plurality of through holes penetrating through the wafer stage between the wafer mounting planar surface and the lower surface; a plurality of wafer supporting rods for supporting the wafer, passing through the through holes and protruding from the wafer mounting planar surface of the wafer stage; and a valve for closing openings of the through holes at the lower surface of the wafer stage when the wafer supporting rods are pulled out of the through holes. Since the wafer can be lifted up from the wafer stage by the wafer supporting rods, it is possible to automate the apparatus using a robot carrier or the like without degrading the characteristics, such as the degree of vacuum in the chamber.

According to a sixth aspect of the present invention, the above-mentioned apparatus further comprises a gas inlet penetrating through the upper part of the chamber and introducing a gas into the chamber from the outside; a gas supply pipe connected to the gas inlet and supplying the gas to the gas inlet; and a heater heating a portion of the gas supply pipe. Since the gas introduced into the chamber after the supporting substrate is adhered to the wafer is heated in advance by the heater, it is avoided that bubbles remain in the adhesive due to rapid cooling of the adhesive.

According to a seventh aspect of the present invention, the above-mentioned apparatus further comprises an air cylinder for driving the upper part of the chamber in the vertical direction, and a pair of slider. Each slider comprises a horizontally movable block that is movable in the horizontal direction and has a sloping upper surface forming a prescribed angle with the horizontal direction; a worm for moving the horizontally movable block; and a vertically movable block that is movable in the vertical direction and has a sloping lower surface contacting the upper surface of the horizontally movable block. In this apparatus, the horizontally movable block is moved in the horizontal direction by rotating the worm, the vertically movable block is moved in the vertical direction with the movement of the horizontally movable block, and the upper part of the chamber is moved with the movement of the vertically movable block, whereby the upper part of the chamber is moved in the vertical direction until the pressure plate, which is positioned above the supporting substrate, contacts the supporting substrate and presses the supporting substrate to the wafer. Therefore, the supporting substrate is pressed toward the wafer with a uniform pressure.

DETAILED DESCRIPTION OF THE PREFERRED EMBODIMENTS

Figure 1:
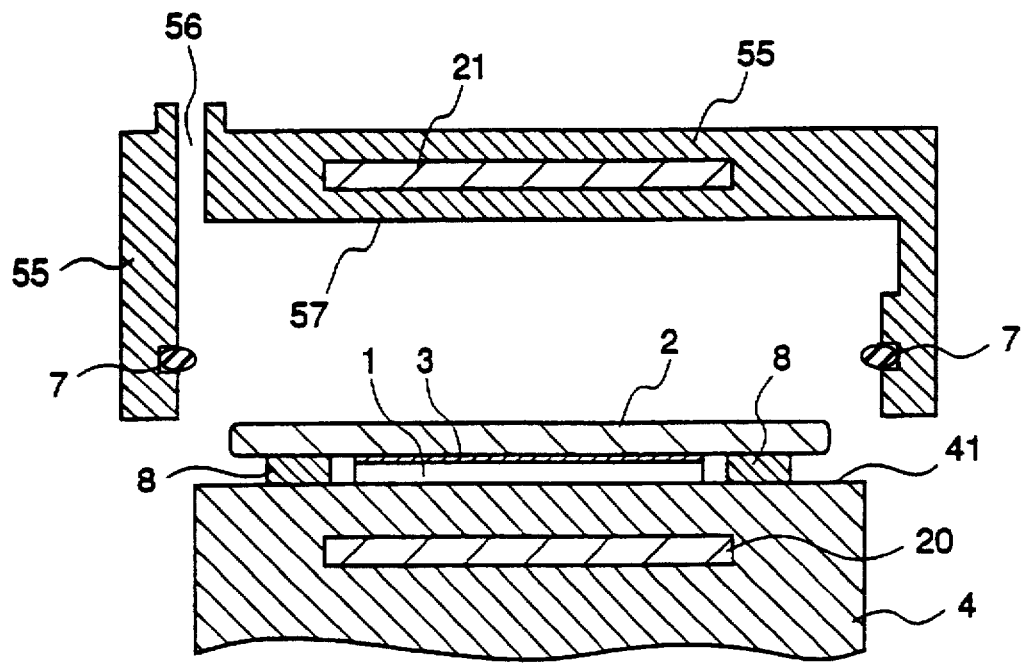
FIGS. 1(a) and 1(b) are cross-sectional views illustrating an apparatus for adhering a wafer to a supporting substrate in accordance with a first embodiment of the present invention.
Figure 1:
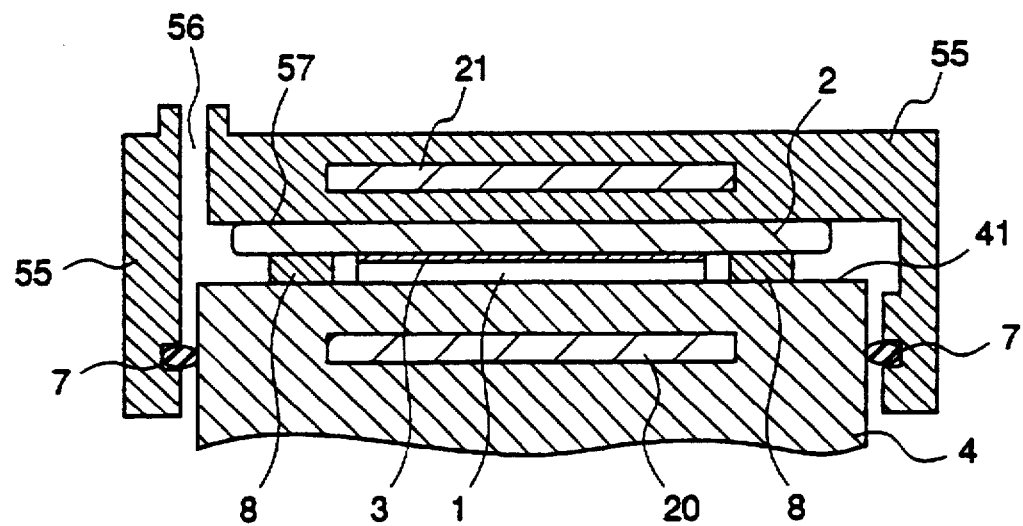

FIG. 1(a) and 1(b) are cross-sectional views illustrating an apparatus and a method for adhering a wafer to a supporting substrate in accordance with a first embodiment of the present invention.

As shown in the figures, the apparatus according to this first embodiment comprises a wafer stage 4 (a lower part of a chamber) having a planar surface 41 on which a wafer 1 is disposed, gauge blocks 8 disposed on the planar surface 41 of the wafer stage 4, and an upper part 55 of the chamber (hereinafter referred to as an upper chamber) covering the wafer stage 4. More specifically, a wafer 1 having a surface covered with wax 3 is put on the planar surface 41 of the wafer stage 4 with the wax 3 facing upward, and a supporting substrate 2 is put on the wafer 1. A portion of the upper chamber 55 opposite the planar surface 41 of the wafer stage 4 serves as a pressure plate 57 for pressing the supporting substrate 2 toward the wafer 1. Further, the upper chamber 55 has an evacuation port 56. The space inside the chamber is hermetically sealed by an O ring 7, and the air inside the chamber can be evacuated through the evacuation port 56. Furthermore, a heater 20 is buried in the wafer stage 4, and a heater 21 is buried in the upper chamber 55. The wafer 1 and the supporting substrate 2 are heated by these heaters 20 and 21. At least three gauge blocks 8 are disposed on the planar surface 41 of the wafer stage 4, at equal intervals, within a region outside the wafer mounting region and inside the edge of the wafer supporting substrate 2. The gauge blocks 8 are standard thickness plates used for calibration of a dial gauge and have a thickness equivalent to the wafer thickness +20 μm. The apparatus shown in FIGS. 1(a) and 1(b) is provided with four gauge blocks 8, and the cross-sectional views are taken along a line crossing opposed two gauge blocks 8.

A description is given of a method of adhering a wafer to a supporting substrate in accordance with the first embodiment of the present invention. Initially, as illustrated in FIG. 1(a), a wafer 1 having a surface with wax 3 is put on the planar surface 41 of the wafer stage 4 with the wax 3 facing upward. Next, at least three gauge blocks 8 having a thickness equivalent to the wafer thickness +20 μm are put on the planar surface 41 of the wafer stage 4, surrounding the wafer 1 at equal intervals. Thereafter, a supporting substrate 2 is put on the wafer 1.

Next, the upper chamber 55 is moved down to a position where the O ring 7 contacts the side surface of the wafer stage 4, whereby the chamber is closed. At this stage, however, the pressure plate 57 does not yet contact the supporting substrate 2. The space inside the chamber is hermetically sealed by the O ring 7. Thereafter, the wafer 1 and the supporting substrate 2 are heated by the heaters 20 and 21, and the air inside the chamber is evacuated through the evacuation port 56, whereby a volatile component in the wax 3 is evaporated.

Thereafter, as illustrated in FIG. 1(b), the upper chamber 55 is moved downward so that the pressure plate 57 contacts the supporting substrate 2 and pushes the supporting substrate 2 toward the wafer 1 until the supporting substrate 2 contacts the gauge blocks 8. Thereby, the wafer 1 is adhered to the supporting substrate 2 with the wax 3.

In this first embodiment of the invention, since the gauge blocks 8 are disposed on the planar surface 41 of the wafer stage 4, surrounding the wafer 1, the supporting substrate 2 is pressed toward the wafer 1 by the pressure plate 57 until the supporting substrate 2 contacts the gauge blocks 8. So, a gap between the supporting substrate 2 and the wafer 1 filled with the wax 3, i.e., the thickness of the wax 3, is determined by a difference between the thickness of the gauge blocks 8 and the thickness of the wafer 1. Therefore, the thickness of the wax 3 is uniform, i.e., 20 μm, within the area of the wafer surface. Although the gauge blocks are preferably 20 μm thicker than the wafer, they may be 10 to 30 μm thicker than the wafer.

[Embodiment 2]

Figure 2:
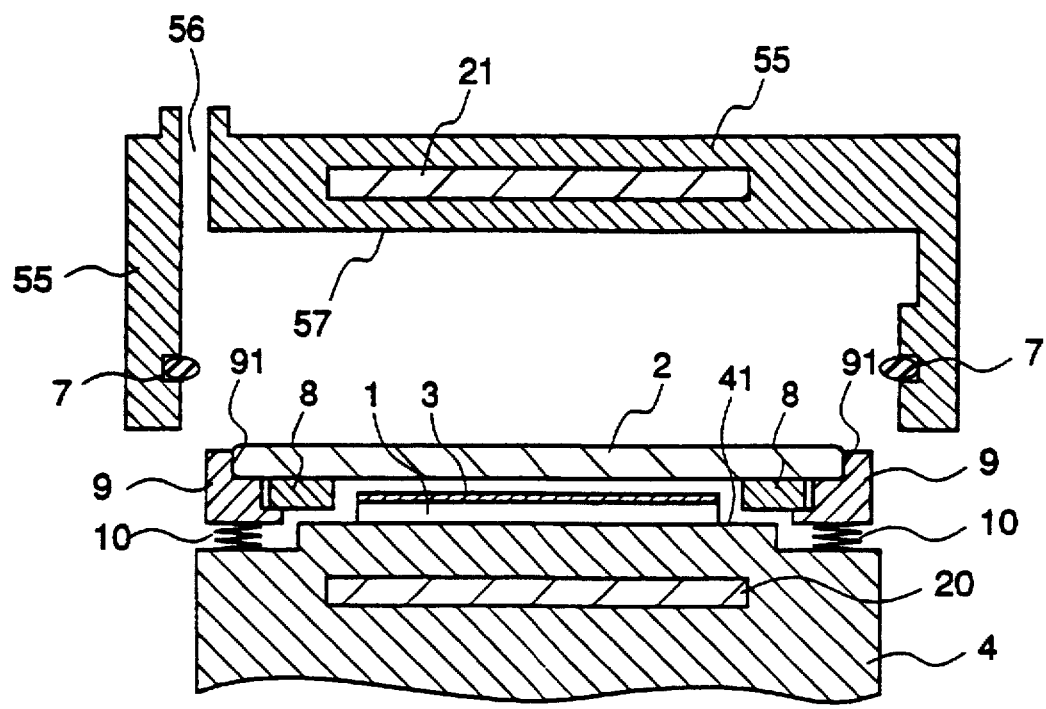
FIGS. 2(a) and 2(b) are cross-sectional views illustrating an apparatus for adhering a wafer to a supporting substrate in accordance with a second embodiment of the present invention.
Figure 2:
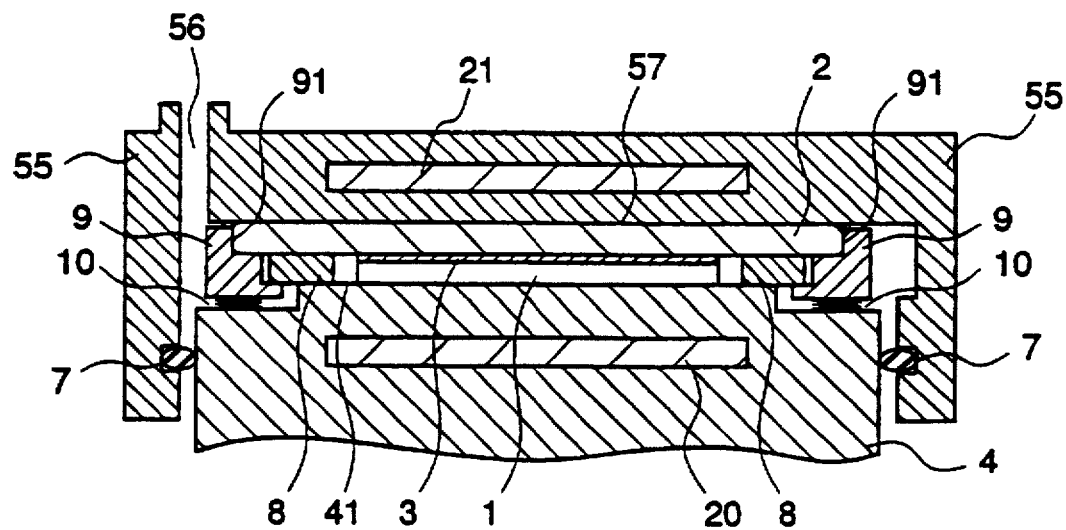

FIGS. 2(a) and 2(b) are cross-sectional views illustrating an apparatus for adhering a wafer to a supporting substrate in accordance with a second embodiment of the present invention. In the figure, the same reference numerals as those shown in FIGS. 1(a) and 1(b) designate the same or corresponding parts. The fundamental structure of the apparatus is identical to the structure according to the first embodiment of the invention. That is, the apparatus comprises the wafer stage 4, the upper chamber 55, and the gauge blocks 8, and the supporting substrate 2 is pressed toward the wafer 1 using the pressure plate 57, with the gauge blocks 8 sandwiched between the supporting substrate 2 and the planar surface 41 of the wafer stage 4, whereby the thickness of the wax 3 between the wafer 1 and the supporting substrate 2 is made uniform within the area of the wafer surface. However, the apparatus according to this second embodiment is different from the apparatus according to the first embodiment in that it includes an annular holder 9 for holding the wafer supporting substrate 2. The annular holder 9 has a counter bore 91 for supporting the wafer supporting substrate 2, and the inside diameter thereof is larger than the maximum diameter of the wafer 1. In addition, the annular holder 9 is connected to the wafer stage 4 through an elastic object, such as springs 10, and at least three gauge blocks 8 are fixed to the annular holder 9. When the supporting substrate 2 is set in the annular holder 9, it contacts the gauge blocks 8.

A description is given of the operation of the apparatus shown in FIGS. 2(a) and 2(b). Initially, as illustrated in FIG. 2(a), a wafer 1 having a surface covered with wax 3 is put on the planar surface 41 of the wafer stage 4 with the wax 3 facing upward. Next, a supporting substrate 2 is put on the counter bore 91 of the annular holder 9. Thereafter, the upper chamber 55 is moved downward until the O ring 7 contacts the side surface of the wafer stage 4. At this stage, however, the pressure plate 57 does not yet contact the supporting substrate 2. Next, the wafer 1 and the supporting substrate 2 are heated with the heaters 20 and 21, and the air inside the chamber is evacuated through the evacuation port 56, whereby a volatile component in the wax 3 is evaporated. Next, as illustrated in FIG. 2(b), the upper chamber 55 is moved downward so that the pressure plate 57 contacts the supporting substrate 2 and presses the supporting substrate 2 toward the wafer 1 until the gauge blocks 8 contact the planar surface 41 of the wafer stage 4. Thereby, the supporting substrate 2 is adhered to the wafer 1 with the wax 3 as an adhesive.

In this second embodiment of the present invention, since the gauge blocks 8 are fixed to the annular holder 9 at such positions that the supporting substrate 2 contacts the gauge blocks 8, the thickness of the wax 3 between the supporting substrate 2 and the wafer 1 is determined by the difference in thicknesses between the gauge blocks 8 and the wafer 1, so that the thickness of the wax 3 can be made uniform within the area of the wafer surface. Further, when the supporting substrate 2 is pressed toward the wafer 1, inclination of the supporting substrate 2 relative to the wafer 1 is absorbed by the springs 10 connecting the annular holder 9 and the wafer stage 4, so that the mechanical stress applied to the wafer 1 and the supporting substrate 2 is reduced. In addition, since the wafer 1 and the supporting substrate 2 are parallel to each other, the uniformity of the thickness of the wax 3 is further improved.

[Embodiment 3]

FIGS. 3(a)–3(d) are cross-sectional views illustrating an apparatus and a method for adhering a wafer to a supporting substrate in accordance with a third embodiment of the present invention. In these figures, the same reference numerals as those shown in FIGS. 2(a) and 2(b) designate the same or corresponding parts. The apparatus according to this third embodiment is fundamentally identical to the apparatus according to the second embodiment except that the wafer stage 4 has three through holes 40 at three-fold symmetrical positions, through which knock pins (wafer supporting rods) 11 pass, and a valve 12 for closing the through holes 40 is disposed on the lower surface of the wafer stage 4. A wafer 1 is put on and removed from the wafer stage 4 using the knock pins 11.

Figure 3:
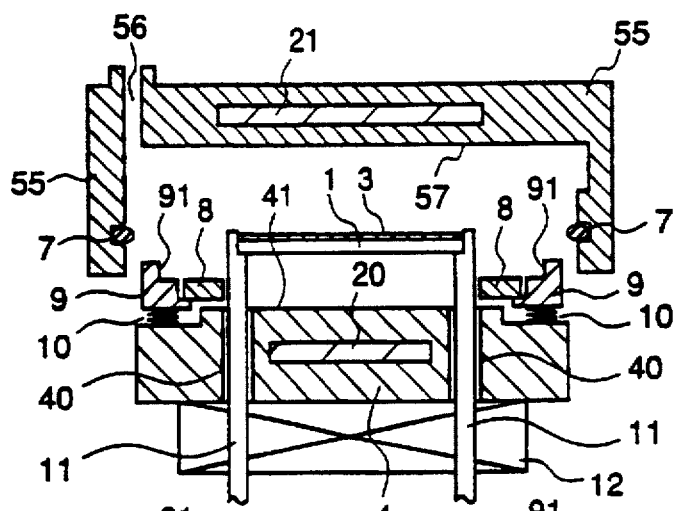
FIGS. 3(a)-3(d) are cross-sectional views illustrating an apparatus for adhering a wafer to a supporting substrate in accordance with a third embodiment of the present invention.
Figure 3:
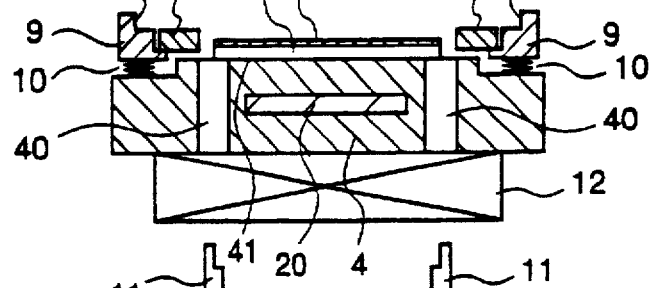
Figure 3:
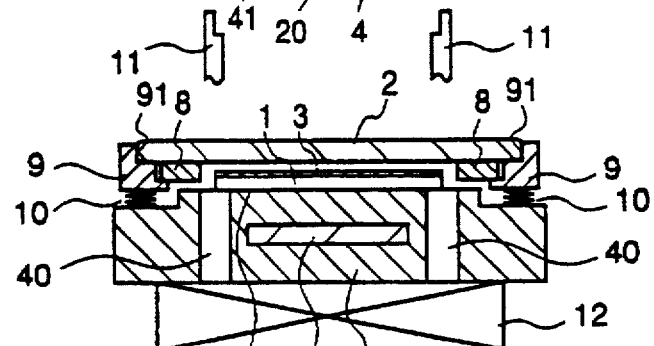
Figure 3:
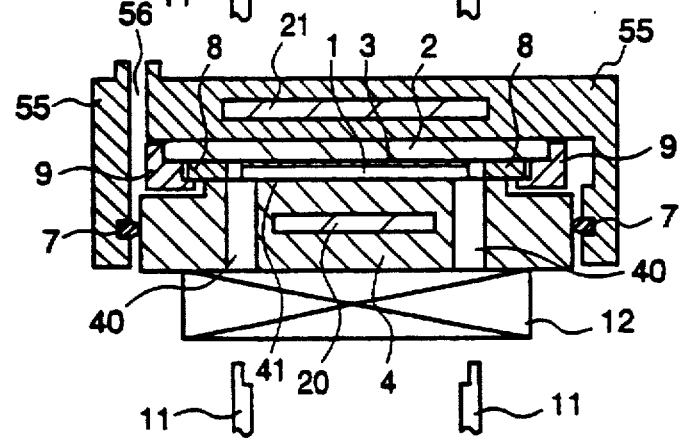

The operation of the apparatus will be described. Initially, as illustrated in FIG. 3(a), a wafer 1 is put on the knock pins 11 with wax 3 facing upward. Thereafter, as illustrated in FIG. 3(b), the knock pins 11 are pulled down through the through holes 40 to set the wafer 1 on the planar surface 41 of the wafer stage 4, and the valve 12 is closed.

In the step of FIG. 3(c), a supporting substrate 2 is put on the counter bore 91 of the annular holder 9. Then, the upper chamber 55 is moved downward to adhere the supporting substrate 2 to the wafer 1 as shown in FIG. 3(d). In FIGS. 3(b) and 3(c), the upper chamber 55 is omitted.

Thereafter, the valve 12 is opened, and the wafer 1 adhered to the supporting substrate 2 is pushed upward using the knock pins 11 and removed from the planar surface 41 of the wafer stage 4. Finally, the wafer 1 with the supporting substrate 2 is withdrawn.

In the apparatus according to the third embodiment of the invention, since the wafer 1 is lifted up from the planar surface 41 of the wafer stage 4 using the knock pins 11, it is possible to automate the processing using a robot carrier or the like without degrading characteristics, such as the degree of vacuum in the chamber.

[Embodiment 4]

Figure 4:
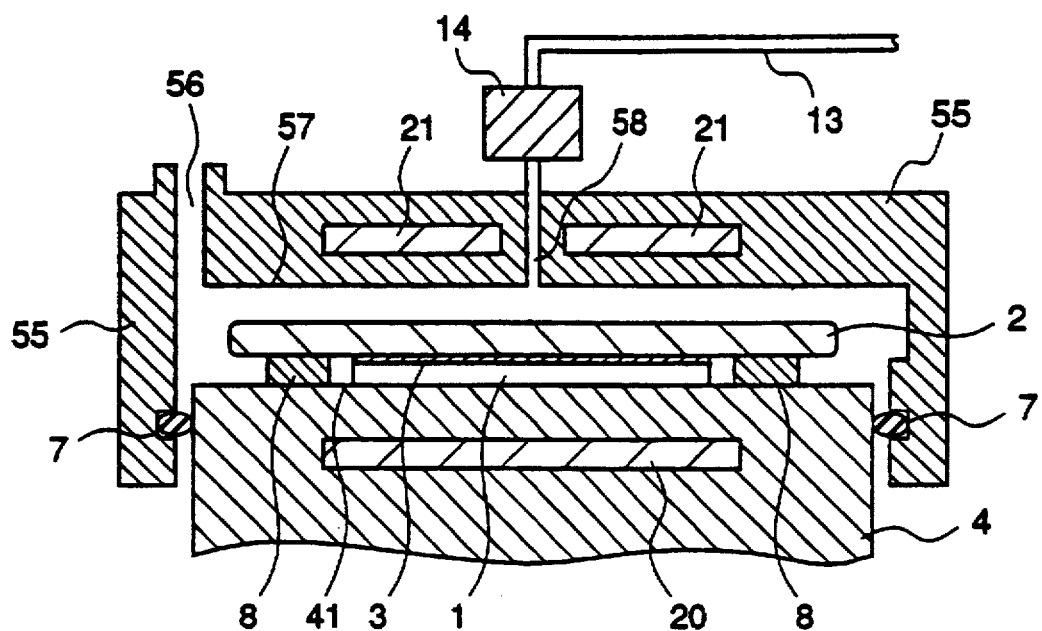
FIG. 4 is a cross-sectional view illustrating an apparatus for adhering a wafer to a supporting substrate in accordance with a fourth embodiment of the present invention.

FIG. 4 is a cross-sectional view illustrating an apparatus for adhering a wafer to a supporting substrate in accordance with a fourth embodiment of the invention. In FIG. 4, the same reference numerals as those shown in FIGS. 1(a) and 1(b) designate the same or corresponding parts. The apparatus according to this fourth embodiment is fundamentally identical to the apparatus according to the first embodiment except that the upper chamber 55 has a gas supply port 58 through which a gas, such as $N_2$ or dry air, is introduced into the chamber, and the through hole 58 is connected to a gas supply pipe 13 which is heated by a heater 14.

A description is given of the operation of the apparatus. Initially, a supporting substrate 2 is adhered to a wafer 1 in the same process steps as described for the first embodiment of the invention. Thereafter, as illustrated in FIG. 4, a heated gas, such as $N_2$ or dry air, is introduced into the chamber through the gas supply pipe 13, which is heated by the heater 14, and through the gas supply port 58, whereby the supporting substrate 2, which is close to the pressure plate 57, is separated from the pressure plate 57. Thereafter, the upper chamber 55 is pulled up to open the chamber.

In the apparatus according to this fourth embodiment of the invention, as in the first embodiment of the invention, the thickness of the wax 3 between the wafer 1 and the supporting substrate 2 is made uniform within the area of the wafer surface. In addition, since the gas introduced into the chamber after the supporting substrate 2 is adhered to the wafer 1 is heated in advance by the heater 14, bubbles remaining in the wax 3 due to rapid cooling of the wax 3 are avoided.

Although the wafer stage 4 according to this fourth embodiment is similar to the wafer stage according to the first embodiment, the wafer stage with the annular holder according to the second embodiment or the wafer stage with the knock pins according to the third embodiment may be employed.

[Embodiment 5]

Figure 5:
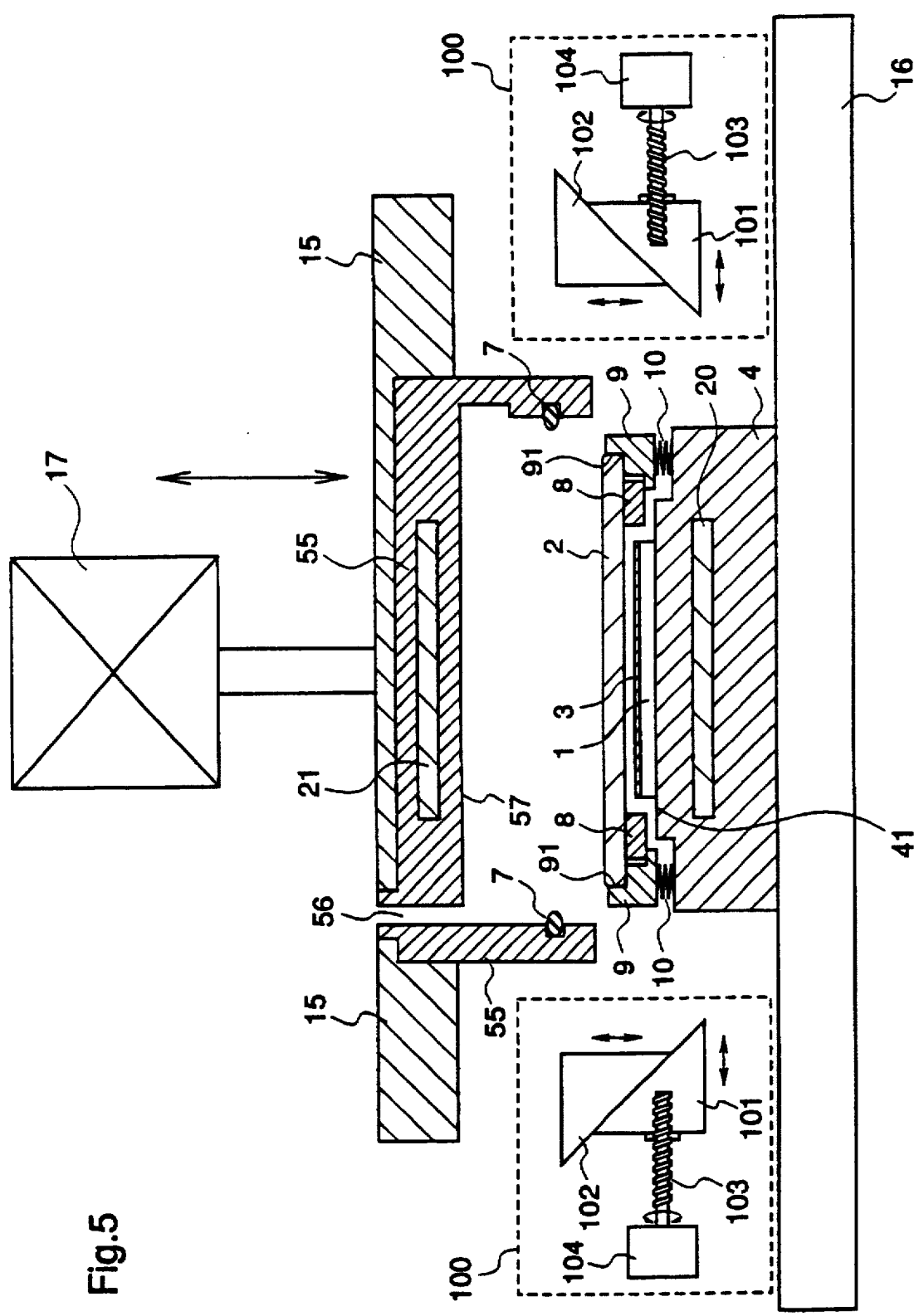
FIG. 5 is a diagram illustrating an apparatus for adhering a wafer to a supporting substrate in accordance with a fourth embodiment of the present invention.
Figure 6:
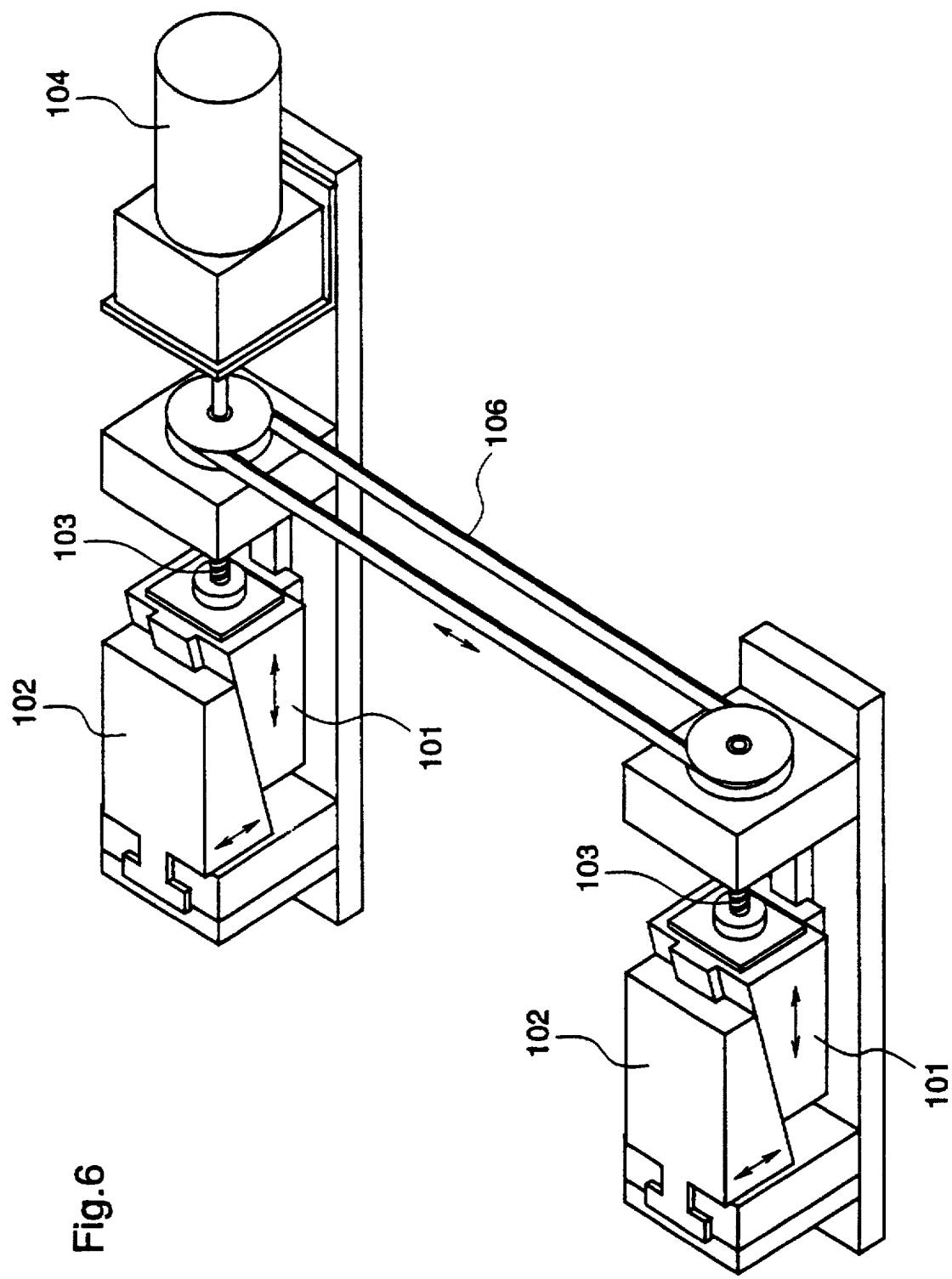
FIG. 6 is a perspective view illustrating sliders included in the apparatus shown in FIG. 5.
Figure 7:
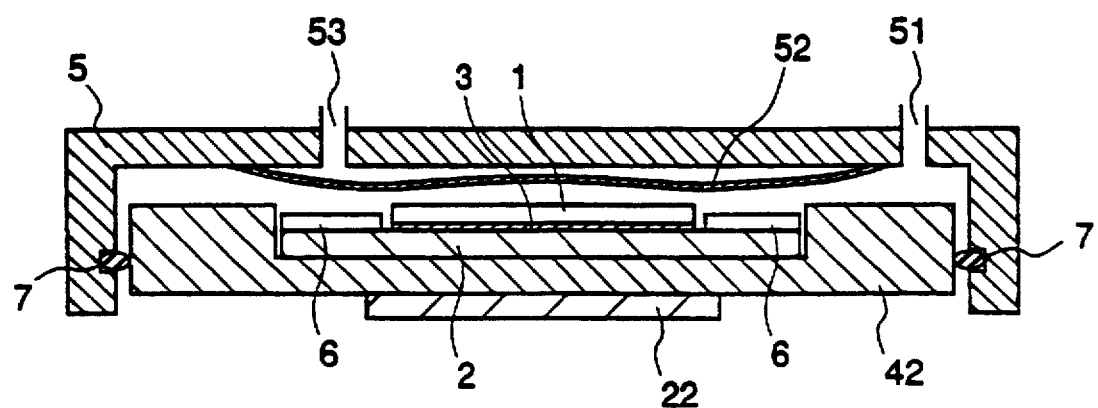
FIGS. 7(a) and 7(b) are cross-sectional views illustrating an apparatus for adhering a wafer to a supporting substrate according to the prior art.
Figure 7:
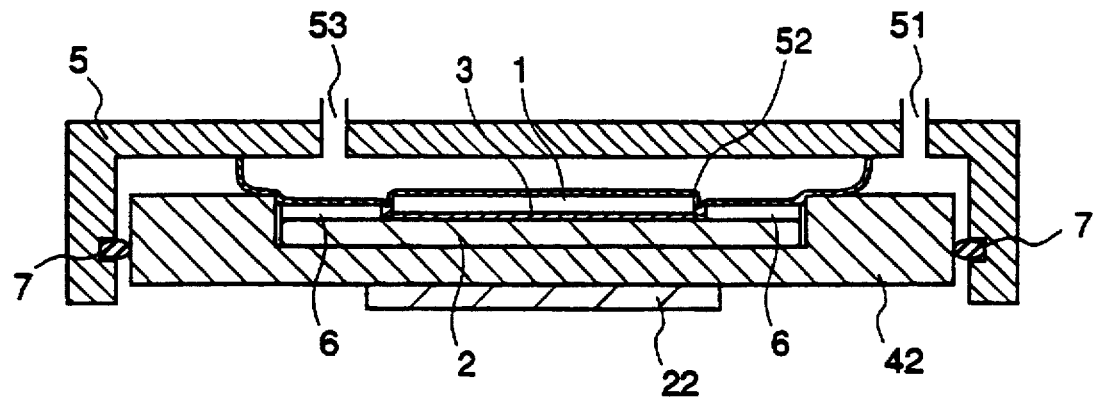

FIG. 5 is a diagram schematically illustrating an apparatus for adhering a wafer to a supporting substrate in accordance with a fifth embodiment of the invention. FIG. 6 is a perspective view illustrating sliders included in the apparatus shown in FIG. 5. In FIG. 5, the same reference numerals as those shown in FIGS. 2(a) and 2(b) designate the same or corresponding parts. The apparatus according to this fifth embodiment is fundamentally identical to the apparatus according to the second embodiment except that the upper chamber 55 is provided with an air cylinder 17 for moving the upper chamber 55 vertically until the pressure plate 57 reaches a position close to the supporting substrate 2, and the chamber is put between a pair of sliders 100. Each slider 100 comprises a horizontally movable block 101 that is movable only in the horizontal direction and has a sloping upper surface forming a prescribed angle with the horizontal direction, a vertically movable block 102 that is movable only in the vertical direction and has a sloping lower surface contacting the upper surface of the horizontally movable block 101, a worm (screw) 103 for moving the horizontally movable block 101, and a motor 104 for rotating the worm 103. The sliders 100 transmit the vertical movement of the vertically movable blocks 102 to the upper chamber 55, whereby the upper chamber 55 moves vertically until the pressure plate 57, which is positioned near the supporting substrate 2, contacts the supporting substrate 2 and the gauge blocks 8 contact the planar surface 41 of the wafer stage 4. An upper plate 15 is fixed to the upper chamber 55, and the lower surface of the upper plate 15 contacts the vertically movable blocks 102 of the sliders 100 when the upper chamber 55 moves downward and reaches a position close to the supporting substrate 2. The wafer stage 4 and the sliders 100 are disposed on a lower plate 16.

Although each slider 100 is provided with a motor 104 in the apparatus shown in FIG. 5, it is possible to drive two sliders 100 with a single motor 104 using a belt 106 as shown in FIG. 6. In FIG. 6, the same reference numerals as in FIG. 5 designate the same or corresponding parts.

A description is given of the operation of the apparatus shown in FIG. 5.

Initially, a wafer 1 is put on the planar surface 41 of the wafer stage 4, and a supporting substrate 2 is put on the counter bore 91 of the annular holder 9. Then, the upper chamber 55 is moved downward using the air cylinder 17 until the pressure plate 57 reaches a prescribed position near the supporting substrate 2. Thereafter, the wafer 1 and the supporting substrate 2 are heated, and the air inside the chamber is evacuated through the evacuation port 56. At this stage, the lower surface of the upper plate 15 contacts the vertically movable blocks 102. Thereafter, the worms 103 are rotated by the motors 104 so that the horizontally movable blocks 101 move horizontally and the vertically movable blocks 102 move downward. The downward movement of the vertically movable blocks 102 is transmitted to the upper plate 15, and the upper chamber 55 moves downward, whereby the pressure plate 57 presses the supporting substrate 2 toward the wafer 1. Since the pressure plate 57 is controlled by the air cylinder 17, a uniform pressure is applied to the supporting substrate 2.

When the air pressure inside the chamber is low, it is difficult to move the upper chamber 55 downward at a low speed using the air cylinder 17, so that bubbles remain in the wax 3. In the apparatus according to the fifth embodiment of the invention, however, the air cylinder 17 roughly moves the upper chamber 55 downward so that the pressure plate 57 does not contact the supporting substrate 2 and, thereafter, the sliders 100 move the upper chamber 55 so that the pressure plate 57 contacts the supporting substrate 2 and presses the supporting substrate 2 toward the wafer 1. That is, the subtle movement of the upper chamber 55 after evacuation of the chamber is controlled by the sliders 100. Therefore, the supporting substrate 2 is pressed toward the wafer 1 with uniform pressure, and bubbles do not remain in the wax 3.

The air cylinder 17 and the sliders 100 according to this fifth embodiment may be applied to the apparatus according to the first, third, and fourth embodiments of the invention.

Although a circular wafer is employed for the first to fifth embodiments of the invention, the shape of the wafer is not restricted as long as the wafer is planar.

What is claimed is:

1. An apparatus for adhering a wafer to a supporting substrate comprising:

a chamber having:

a lower part including a wafer stage having a planar surface on which a wafer may be mounted, and an upper part for covering the planar surface of the wafer stage and including an evacuation port for evacuating the chamber, and a pressure plate movable toward the wafer stage;

at least three gauge blocks having a thickness larger than that of a wafer, disposed on the planar surface of the wafer stage, and sandwiched between the pressure plate and the planar surface when the pressure plate and the wafer stage are brought closer together; and respective heaters embedded in the lower and upper parts of the chamber for heating the wafer stage and a supporting substrate.

2. The apparatus of claim 1 wherein the thickness of the gauge blocks is 10–30 μm larger than the thickness of a wafer.

3. The apparatus of claim 1 comprising an annular holder having an inner diameter larger than the maximum diameter of a wafer, having a counter bore, and resiliently connected to the wafer stage, wherein the gauge blocks are fixed to the annular holder.

4. The apparatus of claim 3 wherein the wafer stage has a plurality of through holes between the planar surface and a lower surface and comprising:

wafer supporting rods for supporting a wafer, passing through the through holes, and protruding from the planar surface of the wafer stage; and a valve for closing the through holes at the lower surface of the wafer stage when the wafer supporting rods are extracted from the through holes.

5. The apparatus of claim 1 wherein the upper part of the chamber has a gas inlet for introducing a gas into the chamber and comprising:

a gas supply pipe connected to the gas inlet for supplying a gas to the gas inlet; and a heater for heating a portion of the gas supply pipe.

6. The apparatus of claim 3 comprising:

an air cylinder for driving the upper part of the chamber vertically; and a pair of sliders, each slider comprising:

a horizontally movable block having a sloping upper surface forming an angle with the horizontal direction;

a worm for moving the horizontally movable block; and a vertically movable block having a sloping lower surface contacting the upper surface of the horizontally movable block, wherein the horizontally movable block is moved by rotating the worm, the vertically movable block is moved in in response to the movement of the horizontally movable block, and the upper part of the chamber is moved in response to movement of the vertically movable block, whereby the upper part of the chamber is moved vertically until the pressure plate contacts and presses a supporting substrate toward a wafer.

7. An apparatus for adhering a wafer to a supporting substrate comprising:

a chamber having:

a lower part including a wafer stage having a planar surface on which a wafer may be mounted, an upper part for covering the planar surface of the wafer stage and including an evacuation port for evacuating the chamber, and a pressure plate movable toward the wafer stage, and heaters for heating the wafer and a supporting substrate; and a spacer having a thickness larger than that of a wafer, disposed on the planar surface of the wafer stage, and sandwiched between the pressure plate and the planar surface when the pressure plate and the wafer stage are brought closer together.

* * * * *